(12) United States Patent
Shirai et al.

(10) Patent No.: US 6,743,039 B2
(45) Date of Patent: Jun. 1, 2004

(54) BALL GRID ARRAY CONNECTOR

(75) Inventors: Hiroshi Shirai, Saitama (JP); Akira Kubo, Tokyo (JP)

(73) Assignee: Tyco Electronics EC K.K., Kanagawa (JP)

( * ) Notice: Subject to any disclaimer, the term of this patent is extended or adjusted under 35 U.S.C. 154(b) by 0 days.

(21) Appl. No.: 10/256,650

(22) Filed: Sep. 27, 2002

(65) Prior Publication Data

US 2003/0068917 A1 Apr. 10, 2003

(30) Foreign Application Priority Data

Oct. 3, 2001 (JP) .................................. 2001-307163

(51) Int. Cl.[7] .......................................... H01R 13/625
(52) U.S. Cl. ....................... 439/342; 439/259; 439/268; 439/264; 439/266; 174/260; 361/760; 361/818; 361/761; 361/785; 361/679; 361/748; 361/776
(58) Field of Search ................... 439/342, 259, 439/268, 264, 266; 174/260; 361/760, 818, 761, 785, 762, 679, 748, 776

(56) References Cited

U.S. PATENT DOCUMENTS

| | | | | |
|---|---|---|---|---|
| 5,855,489 A | * | 1/1999 | Walker ....................... | 439/342 |
| 6,023,029 A | * | 2/2000 | Armezzani et al. .......... | 174/260 |
| 6,108,212 A | * | 8/2000 | Lach et al. .................. | 361/768 |
| 6,303,876 B1 | * | 10/2001 | Miyazaki ..................... | 174/260 |
| 6,350,142 B1 | * | 2/2002 | Shirai et al. ................ | 439/342 |
| 6,369,331 B1 | * | 4/2002 | Kusano et al. .............. | 174/260 |
| 6,388,199 B1 | * | 5/2002 | Jiang et al. .................. | 174/255 |

\* cited by examiner

*Primary Examiner*—Dean A. Reichard
*Assistant Examiner*—Anton Harris
(74) *Attorney, Agent, or Firm*—Barley Snyder

(57) ABSTRACT

A ball grid array connector having an insulative housing with a plurality of contacts in electrical connection with corresponding solder balls that protrude from a surface of the housing. The solder balls form a soldering region for attachment to a circuit board. The housing has a center of gravity biased from a center of the soldering region, and a positional compensation member is attached to the housing and the circuit board. The positional compensation member prevents the housing from becoming inclined with respect to the circuit board when the solder balls are attached to the circuit board and prevents the housing from becoming inclined with respect to an electronic part when the electronic part is mounted to the housing on a side opposite from the circuit board.

22 Claims, 5 Drawing Sheets

BALL GRID ARRAY CONNECTOR

BACKGROUND OF THE INVENTION

The invention relates to electrical connectors and, more specifically, to ball grid array connectors having a plurality of solder balls for surface mounting that are connected to pin grid arrays.

DESCRIPTION OF THE PRIOR ART

Japanese Unexamined Patent Publication No. 2000-357572 discloses an integrated circuit (IC) package connector having a ball grid array connector. The connector has a base housing with a plurality of contacts arranged in a matrix, and a sliding cover housing with openings corresponding to the contacts. The contacts are connected to a printed circuit board via solder balls or tines. The IC package has a pin grid array mounted on the cover housing. The pins serve as electrodes and are connected to the contacts on the base housing. Because the IC package has an extremely large number of pins, the connection resistance between the pins and the contacts is great. Therefore, after the pins are inserted within the openings of the cover housing, the cover housing with the IC package mounted thereon is slid by a power assist mechanism to electrically connect the contacts and the pins.

The power assist mechanism has a drive mechanism that acts like a lever provided at an end portion of the connector. Because a large amount of force is required to slide the cover housing to electrically connect the pins and the contacts, the drive mechanism is operated by a tool, such as, a screwdriver. Metal parts are commonly used for the operating parts of the drive mechanism for durability.

In the aforementioned connector, the center of gravity of the connector is biased due to the existence of the drive mechanism, which utilizes heavy metal parts, at the end portion of the connector. In other words, the center of gravity of the connector is at a position biased towards the drive mechanism side, as opposed to the center of the soldering region of the contacts that are soldered to the circuit board.

Due to the positional misalignment between the center of the soldering region and the center of gravity of the connector, during reflow soldering of the connector to the circuit board, the heavier drive mechanism side may be caused to rotate toward the circuit board causing the lighter connector end portion on the opposite side to separate from the circuit board. As a result, the connector may be mounted to the circuit board at an inclination causing electrical connection failure.

In addition, there are cases in which the circuit board undergoes a second reflow soldering process to mount electronic parts on an upper surface of the circuit board opposite of the connector. In this process, the connector that has already been soldered to the circuit board is suspended on the circuit board while the electronic parts are mounted on the upper surface of the circuit board. As the atmospheric temperature near the circuit board rises, the soldering portions between the connector and the circuit board soften and melt. Generally, the soldered portions that melt remain mounted to the circuit board due to surface tension. However, if the center of gravity of the connector is positionally misaligned from the center of the soldering region, a rotational movement is generated by the weight of the drive mechanism so that the end portion on the drive mechanism side separates from the circuit board causing the connector to become inclined with respect to the circuit board, fixing the connector to the circuit board in an inclined state. In this state, there is a possibility that electrical connections will fail or that the connector will detach from the circuit board.

In addition, there are cases in which a heat sink is mounted on the IC package to dissipate heat. The heat sink is mounted parallel to the circuit board. A problem darises in that the heat sink does not appropriately contact the inclined surface of the IC package mounted on the inclined connector such that sufficient heat dissipation is not obtained. Because computer central processing units (CPU) operate at high speeds and generate a high amount of heat, if the heat dissipation is insufficient there is a possibility that it will negatively effect the operation of the CPU.

It is therefore desirable to provide a ball grid array connector that enables reflow soldering of the connector parallel to a circuit board, even in cases where the center of gravity of a housing assembly is positionally misaligned with the center of the soldering region. It is further desirable to provide a ball grid array connector to which a circuit board mounted type heat sink is attachable to obtain sufficient heat dissipation.

SUMMARY OF THE INVENTION

This and other objects are solved by an electrical connector having an insulative housing with a plurality of contacts in electrical connection with corresponding solder balls that protrude from a surface of the housing. The solder balls form a soldering region for attachment to a circuit board. The housing has a center of gravity biased from a center of the soldering region, and a positional compensation member is attached to the housing and the circuit board. The positional compensation member prevents the housing from becoming inclined with respect to the circuit board when the solder balls are attached to the circuit board and prevents the housing from becoming inclined with respect to an electronic part when the electronic part is mounted to the housing on a side opposite from the circuit board.

BRIEF DESCRIPTION OF THE DRAWINGS

FIG. 5A shows a state in which the connector is not appropriately mounted on the circuit board. FIG. 5B shows a state in which the connector is appropriately mounted on the circuit board.

DETAILED DESCRIPTION OF THE PREFERRED EMBODIMENT

Figure 1:
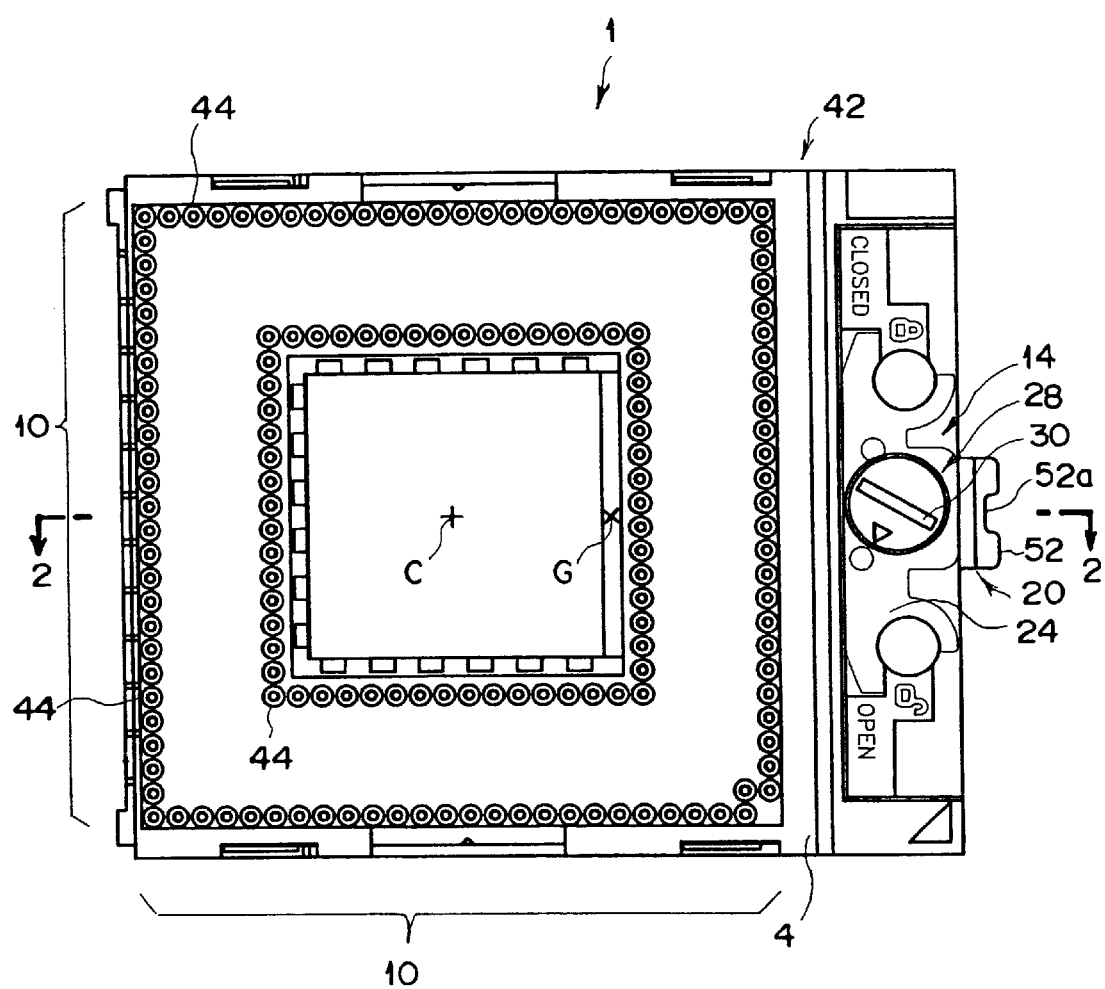
FIG. 1 is a plan view of a connector of the present invention.
Figure 2:
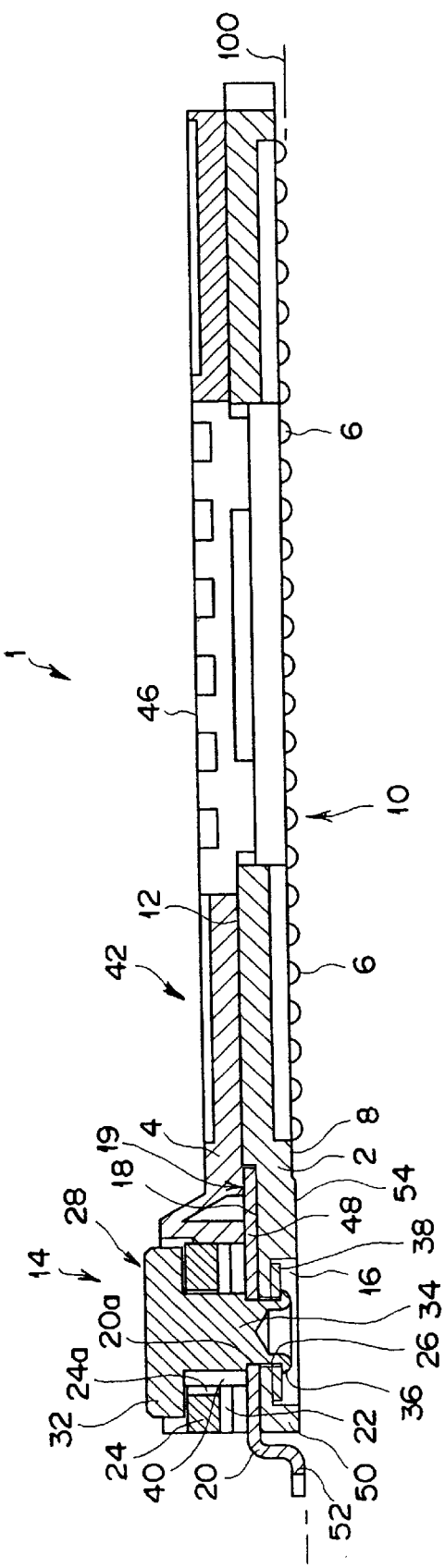
FIG. 2 is a cross-sectional view taken along line 2—2 of FIG. 1.

FIGS. 1 and 2 show a ball grid array connector 1 having an insulative base housing 2 and a cover housing 4 slidably arranged on the base housing 2. A plurality of contacts (not shown), which act as electrodes, is arranged in a matrix on the base housing 2. Shown in FIG. 2, each of the contacts is in electrical connection with a solder ball 6. The solder balls 6 are arranged in a matrix on the base housing 2 corresponding to the contacts to form a ball grid array or soldering region 10. A standoff 54 that protrudes slightly from a bottom surface 8 of the base housing 2 is integrally formed with the base housing 2 at an end portion 50 thereof. The solder balls 6 protrude from the bottom surface 8 of the base housing 2 towards a circuit board 100 slightly more than the standoff 54. The solder balls 6 are soldered onto the circuit board 100.

Shown in FIG. 1, a plurality of openings 44 for receiving the pins or electrodes of an IC package 90, shown in FIG. 5, are arranged in a matrix on an upper surface of the cover housing 4 to correspond to the soldering region 10. FIG. 1 only shows an inner and outer edge of the openings 44, the intermediate openings have been omitted.

A drive mechanism 14 for sliding the cover housing 4 along an upper surface of the base housing 2 is provided at the end portion 50. The drive mechanism 14 is provided away from the soldering region 10. The drive mechanism 14 is similar to the drive mechanism disclosed in Japanese Unexamined Patent Publication No. 2000-173735 that uses a metallic eccentric cam member.

The basic structure of the drive mechanism 14 will now be described in greater detail with reference to FIG. 2. A recess 16 is formed in the bottom surface 8 of the base housing 2 at the end portion 50 where the standoff 54 is formed. A depression 18 for arranging a base plate having a solder peg 20 is formed in the upper surface 12 of the base housing corresponding to the recess 16. The recess 16 and the depression 18 are in communication with each other via an aperture 26. An indentation 22 is formed in the cover housing 4 at a portion that corresponds to the depression 18. A metal plate 24 having an aperture 24a formed therethrough is fixed within the indentation 22.

A metallic cam member 28 is inserted through the aperture 24a and the aperture 26 and mounted to construct a housing assembly 42. The cam member 28 has a flange portion 32 with a tool engaging groove 30, shown in FIG. 1, on an upper surface. A trunk portion 34 extends downward from the approximate center of a lower surface of the flange portion 32. The trunk portion 34 is inserted through the aperture 24a of the metal plate 24, the aperture 20a of the base plate 19, and the aperture 26 of the base housing 2. The trunk portion 34 protrudes within the recess 16 and a washer 38 is fixed at a tip 36 to prevent extraction thereof. The cam member 28 is rotatably supported by the aperture 20a of the base plate 19.

The base plate 19 reinforces the portion of the base housing 2 near the recess 16 and supports the cam member 28. To support the force imparted by the cam member 28 across a large area of the base housing 2, the base plate 19 is substantially rectangular in shape (not shown) and extends substantially to both edges of the connector 1 at one end thereof on both sides of the solder peg 20. A cam 40 is formed at an outer periphery of the trunk portion 34 at a portion corresponding to the metal plate 24. This structure causes the cam 40 to engage with and drive the metal plate 24 when the cam member 28 is rotated. The metal plate 24 slides the cover housing 4.

The solder peg 20 acts as a positional compensation member and may be constructed of simple parts. The solder peg 20 has a flat portion 48 arranged in the recess 18 of the base housing 2 in the portion of the base plate 19. A tine portion 52 extends outwardly from the end portion 50 of the base housing 2 and is bent towards and then substantially parallel to the circuit board 100. Shown in FIG. 1, the tine portion 52 has a cutout 52a. The cutout 52a serves to increase the length of the solder fillet formed when the tine portion 52 is soldered to the circuit board 100 to increase the length of the periphery of the tine portion 52 and the surface tension of the melted solder. Although the solder peg 20 is described as having a single cutout 52a, a plurality of cutouts may be provided. The tine portion 52 protrudes slightly further than the standoff 54 towards the circuit board 100. Because the solder peg 20 does not protrude outside of the periphery of the connector 1, the area occupied by the connector 1 may be minimized.

It will be understood and appreciated by those skilled in the art, that although the solder peg 20 is described as being positioned at the end portion 50 of the base housing 2, the solder peg 20 may be provided at the end portion opposite the end portion 50. Further, although the drive mechanism 14 is shown positioned on the central axis of the connector 1, the drive mechanism 14 may be positioned at any desired position spanning from the upper right portion to the lower right portion of FIG. 1. The drive mechanism 14 may also be operated by a lever instead of a tool.

Figure 3:
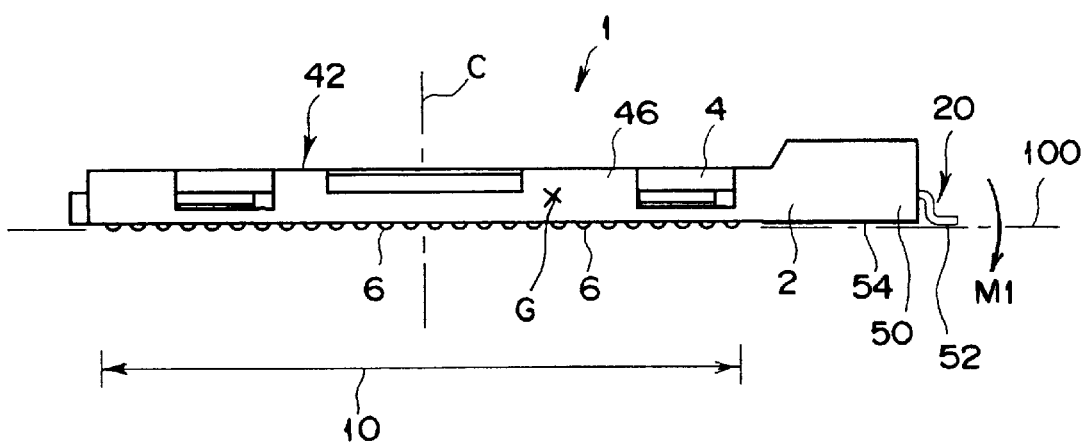
FIG. 3 is a side view of the connector shown in FIG. 1 showing the position of the connector during a first reflow soldering operation.
Figure 4:
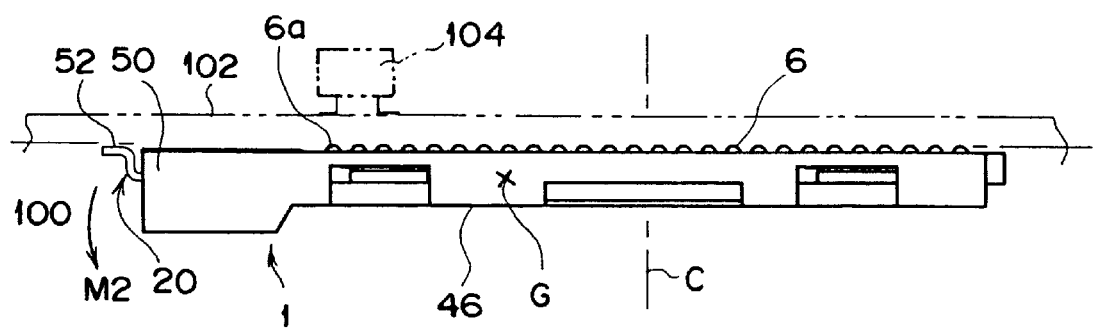
FIG. 4 is a side view of the connector shown in FIG. 1 showing the position of the connector during a second reflow soldering operation.

The first reflow soldering process and second reflow soldering process will now be described in greater detail with reference to FIGS. 1, 3, and 4. A state in which an IC package 90 and a heat sink 92 are mounted on the connector 1 will be described with reference to FIGS. 5A and 5B. The first and second reflow soldering processes will be described with reference to the center of the soldering region 10 designated as C and the center of gravity of the housing assembly 42 designated as G. Because the drive mechanism 14 is provided with the metal plate 24 and the cam member 28, which contribute to the weight of the drive mechanism 14, the center of gravity G of the housing assembly 42 is biased towards the drive mechanism 14 from the center C.

The first reflow soldering process of soldering the housing assembly 42 to the circuit board 100 will now be described with reference to FIG. 3. During the first reflow soldering process, the housing assembly 42 is positioned on the circuit board 100 with no support, as shown in FIG. 3. When the atmospheric temperature reaches the melting temperature of the solder balls 6, the solder balls 6 begin to melt, and the solder balls 6 become fused with conductive pads at predetermined positions on the circuit board 100. At this time, because the center of gravity G is biased away from the center C of the soldering region 10, a rotational movement is generated at the end portion 50 of the base housing 2 in the direction indicated by arrow M1. This rotational movement may cause the end portion 50 to sink with respect to the circuit board 100. In other words, there is a possibility that the right side of the housing assembly 42, as shown in FIG. 3, will become lower than the left side.

The tine portion 52 of the solder peg 20 protrudes toward the circuit board 100 and is soldered thereto. Thereby, the tine portion 52 prevents the sinking of the end portion 50, and the upper surface 46 of the housing assembly 42 is maintained parallel with respect to the circuit board 100. When the first reflow soldering process is completed, the melted solder balls 6 harden, and the housing assembly 42 is fixed to the circuit board 100. In this process, the solder peg 20 serves a purpose similar to that of the standoff 54, but differs therefrom in the point that it is soldered and fixed to the circuit board 100. The importance of the function of the solder peg 20 will be further clarified in the following description of the second reflow soldering process.

The second reflow soldering process for mounting an electronic part 104 on a surface 102 of the circuit board 100 on a side opposite from that on which the connector 1 has been mounted will now be described with reference to FIG. 4. The electronic part 104 is placed on the circuit board 100 and is surface mounted thereon in a high temperature atmosphere in the same manner as described above. When the electronic part 104 is surface mounted, the soldered portions of the connector 1 are also exposed to the high temperature atmosphere and soften. Because the center of gravity G is biased away from the center C of the soldering region, a rotational movement is generated in the direction indicated by arrow M2, opposite from that of arrow M1, causing the left side of the connector 1, as shown in FIG. 4, to become lower. Therefore, the solder ball 6a closest to the end portion 50 of the base housing 2 is at risk of separating from the circuit board 100, making the connection therebetween unstable. If the second reflow soldering process is completed in this state, the connector 1 will be fixed to the circuit board 100 in an inclined state or the soldered portions starting with the solder ball 6a may separate sequentially causing the connector 1 to detach from the circuit board 100.

Because the tine portion 52 of the solder peg 20 has a relatively large area and is positively soldered to the circuit board 100, even if the rotational moment shown by the arrow M2 is generated, the connector 1 does not change its position due to the surface tension at the tine portion 52. Therefore, the upper surface 46 maintains a parallel relationship with the circuit board 100. In this manner, the solder peg 20 controls the position of the connector 1 during the second reflow soldering process. The solder peg 20, therefore, has a completely different function from conventional solder pegs that are generally used to mount electronic parts and the like to a circuit board.

Figure 5A:
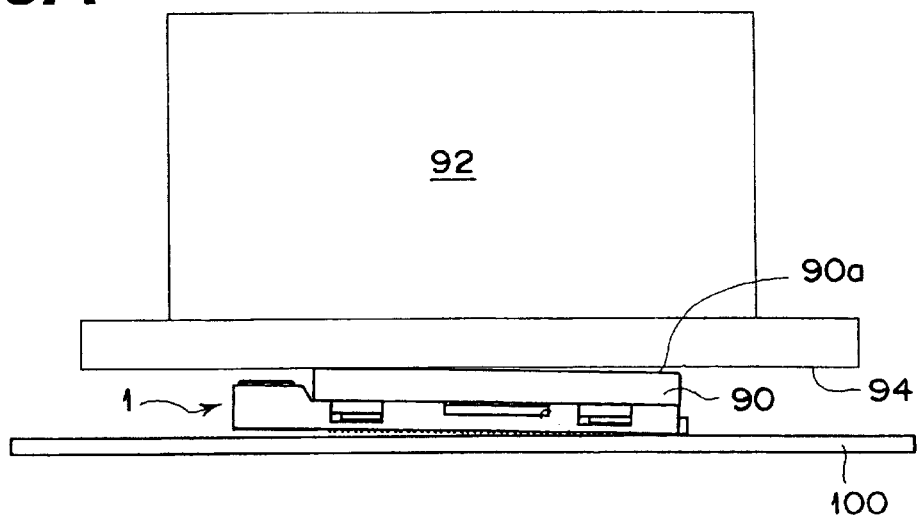
FIGS. 5A and 5B are side views of the connector mounted to a circuit board with an IC package and a heat sink mounted thereon.

The state in which the IC package 90 and the heat sink 92 are mounted on the connector 1 will now be described in greater detail with reference to FIGS. 5A and 5B. Shown in FIG. 5A, when the connector 1 is not properly mounted on the circuit board 100, the electrical connection between the solder balls 6 of the connector 1 and the circuit board 100 are unstable. Because an upper surface 90a of the IC package 90 is inclined with respect to the circuit board 100, a bottom surface 94 of the heat sink 92 that is mounted parallel to the circuit board 100 looses surface contact with the upper surface 90a of the IC package 90. Sufficient heat dissipation, therefore, is not obtained.

Figure 5B:
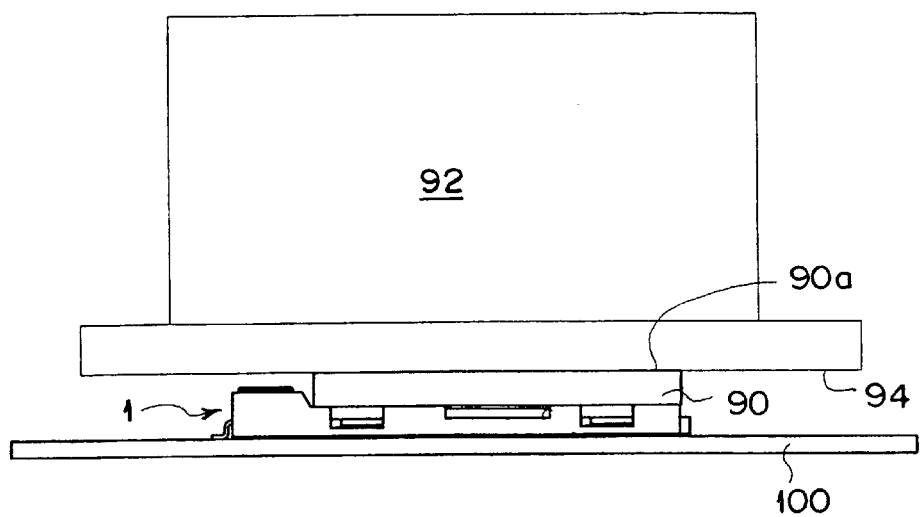

Shown in FIG. 5B, when the connector 1 is mounted on the circuit board 100 with the assistance of the solder peg 20, the position of the connector 1 is properly maintained. In this state, the upper surface 46 of the housing assembly 42, the upper surface 90a of the IC package 90, and the bottom surface 94 of the heat sink 92 are parallel with respect to the circuit board 100 to make a reliable electrical connection. In addition, due to the surface contact between the upper surface 90a of the IC package 90 and the bottom surface 94 of the heat sink 92, sufficient heat dissipation is obtained.

To obtain satisfactory performance, the angle of inclination of the connector 1 should be within the range of ±0.2°. To determine the height of the solder peg 20 that would yield an angle of inclination within the range of ±0.2°, different heights were set for the solder peg 20 of the connector 1, and thirteen experiments were performed for each of the heights. The direction in which the drive mechanism side separated from the circuit board is designated as a positive (+), and the direction in which the drive mechanism side approached the circuit board is designated as a negative (−). The protrusive height of the standoff 54 from the bottom surface 8 of the base housing 2 was 0.1 mm, and the protrusive height of the solder balls 6 from the standoff 54 was 0.25 mm. The results are shown in Table 1:

TABLE 1

Measured Values of the Angle of Inclination of the Connector

| Height between standoff and solder peg | 0.1 mm | 0.2 mm | 0.3 mm |
|---|---|---|---|
| After first reflow soldering | −0.18°~−0.07° | −0.16°~−0.02° | −0.11°~−0.05° |
| After second reflow soldering | −0.05°~+0.16° | −0.15°~0° | −0.08°~+0.13° |

From the above experimental results, it was shown that in cases in which the height of the solder peg 20 from the standoff 54 was 0.1 mm, 0.2 mm, and 0.3 mm, the angle of inclination of the connector 1 was within the range of ±0.2°.

The foregoing illustrates some of the possibilities for practicing the invention. Many other embodiments are possible within the scope and spirit of the invention. For example, the embodiment herein was described with a connector for an IC package, however, the invention may be applied to an electrical connector that uses a surface mounted ball grid array having a plurality of electrodes for connection with another connector. In addition, instead of a solder peg 20, a relatively heavy attachment may be mounted on the end portion or integrally formed with the base housing 2 and/or the cover housing 4 opposite the drive mechanism 14.

We claim:

1. An electrical connector comprising:
   an insulative housing having a plurality of contacts in electrical connection with corresponding solder balls that protrude from a surface of the housing to form a soldering region for attachment to a circuit board, the housing having a center of gravity biased from a center of the soldering region; and
   a positional compensation member attached to the housing and the circuit board to prevent the housing from becoming inclined with respect to the circuit board when the solder balls are attached to the circuit board.

2. The electrical connector of claim 1, wherein the positional compensation member prevents the housing from becoming inclined with respect to an electronic part when the electronic part is mounted to the circuit board on a side opposite from the housing.

3. The electrical connector of claim 1, wherein the positional compensation member is a solder peg.

4. The electrical connector of claim 3, wherein the solder peg is metallic.

5. The electrical connector of claim 1, further comprising a standoff that protrudes toward the circuit board a distance less than the solder balls.

6. The electrical connector of claim 1, further comprising a base plate that supports the positional compensation member.

7. The electrical connector of claim 6, wherein the base plate is integral with the positional compensation member.

8. The electrical connector of claim 1, wherein the positional compensation member has a tine portion that extends from an end of the housing that is bent substantially parallel to the circuit board.

9. The electrical connector of claim 8, further comprising a standoff that protrudes toward the circuit board a distance less than the tine portion.

10. The electrical connector of claim 9, wherein the tine portion protrudes toward the circuit board a distance between 0.1 mm to 0.3 mm greater than the standoff.

11. The electrical connector of claim 1, wherein the positional compensation member has a tine portion that extends from an end of the housing that has a cutout for forming a solder fillet when the positional compensation member is attached to the circuit board.

12. The electrical connector of claim 1, wherein the positional compensation member is positioned on a side of the housing closer to the center of gravity.

13. A ball grid array connector comprising:
   an insulative housing having a plurality of contacts in electrical connection with corresponding solder balls that protrude from a surface of the housing to form a soldering region for attachment to a circuit board;
   a drive mechanism mounted on a side of the housing for sliding a cover mounted on the housing; and
   a positional compensation member attached to the housing and the circuit board to prevent the housing from becoming inclined with respect to the circuit board when the solder balls are attached to the circuit board.

14. The ball grid array connector of claim 13, wherein the positional compensation member is a solder peg.

15. The ball grid array connector of claim 14, wherein the solder peg is metallic.

16. The ball grid array connector of claim 13, further comprising a cam member having a base plate that supports the positional compensation member.

17. The ball grid array connector of claim 16, wherein the base plate is integral with the positional compensation member.

18. The ball grid array connector of claim 13, wherein the positional compensation member has a tine portion that extends from an end of the housing that is bent substantially parallel to the circuit board.

19. The ball grid array connector of claim 13, wherein the positional compensation member has a tine portion that extends from an end of the housing that has a cutout for forming a solder fillet when the positional compensation member is attached to the circuit board.

20. The ball grid array connector of claim 13, wherein the positional compensation member is positioned on a side of the housing closer to the center of gravity.

21. The ball grid array connector of claim 13, wherein the positional compensation member prevents the housing from becoming inclined with respect to an electronic part when the electronic part is mounted to the circuit board on a side opposite from the housing.

22. The ball grid array connector of claim 13, further comprising a standoff that protrudes toward the circuit board a distance between 0.1 mm to 0.3 mm less than the positional compensation member.

* * * * *